United States Patent [19]

Ouyang et al.

[11] Patent Number: 4,706,045
[45] Date of Patent: Nov. 10, 1987

[54] VOLTAGE CONTROLLED OSCILLATOR WITH DUAL LOOP RESONANT TANK CIRCUIT

[75] Inventors: Kenneth W. Ouyang, Huntington Beach; Richard W. Hull, Laguna Hills, both of Calif.

[73] Assignee: Western Digital Corporation, Irvine, Calif.

[21] Appl. No.: 940,038

[22] Filed: Dec. 10, 1986

[51] Int. Cl.$^4$ .............................................. H03B 5/00
[52] U.S. Cl. ............................. 331/117 FE; 331/167
[58] Field of Search ............ 331/117 R, 117 FE, 135, 331/167; 307/151

[56] References Cited

U.S. PATENT DOCUMENTS 3,806,828  4/1974  Johnson ..................... 331/117 R X
4,310,807  1/1982  McKee ........................... 331/167 X Primary Examiner—Eugene R. LaRoche
Assistant Examiner—Robert J. Pascal
Attorney, Agent, or Firm—Spensley Horn Jubas & Lubitz

[57] ABSTRACT

A voltage controlled oscillator (VCO) has an LC tank circuit which is pumped by two out-of-phase feedback components. The combined effect of the two out-of-phase feedback components results in an effective feedback signal that is a function of the ratio of the magnitude of the two out-of-phase coponents. The magnitude of one of these feedback components is controlled by a CMOS subthreshold Gilbert multiplier. The frequency of oscillation of an oscillating signal within the LC tank circuit changes according to a control voltage applied to the Gilbert multiplier.

14 Claims, 10 Drawing Figures

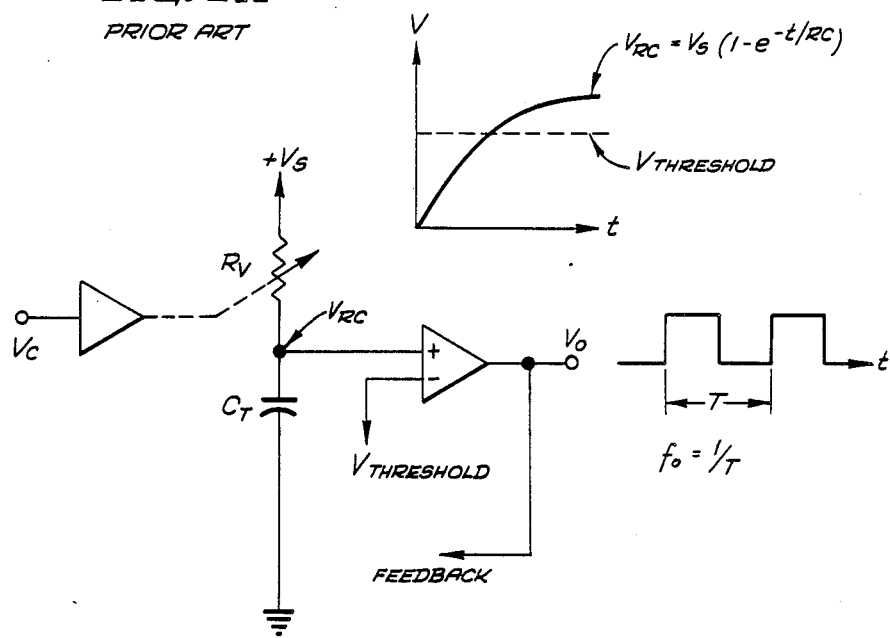
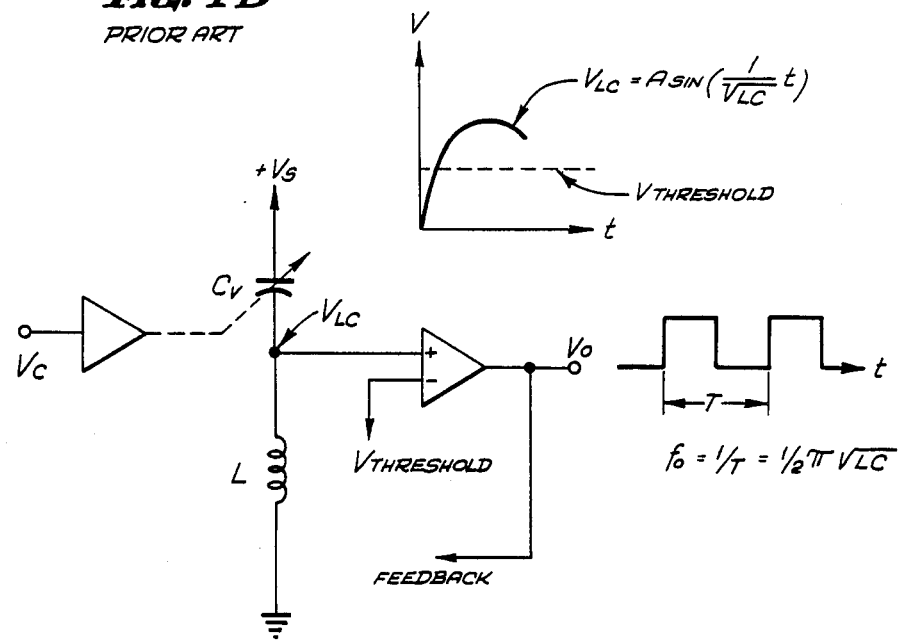

$\theta = \tan^{-1} I_{90}/I_0$

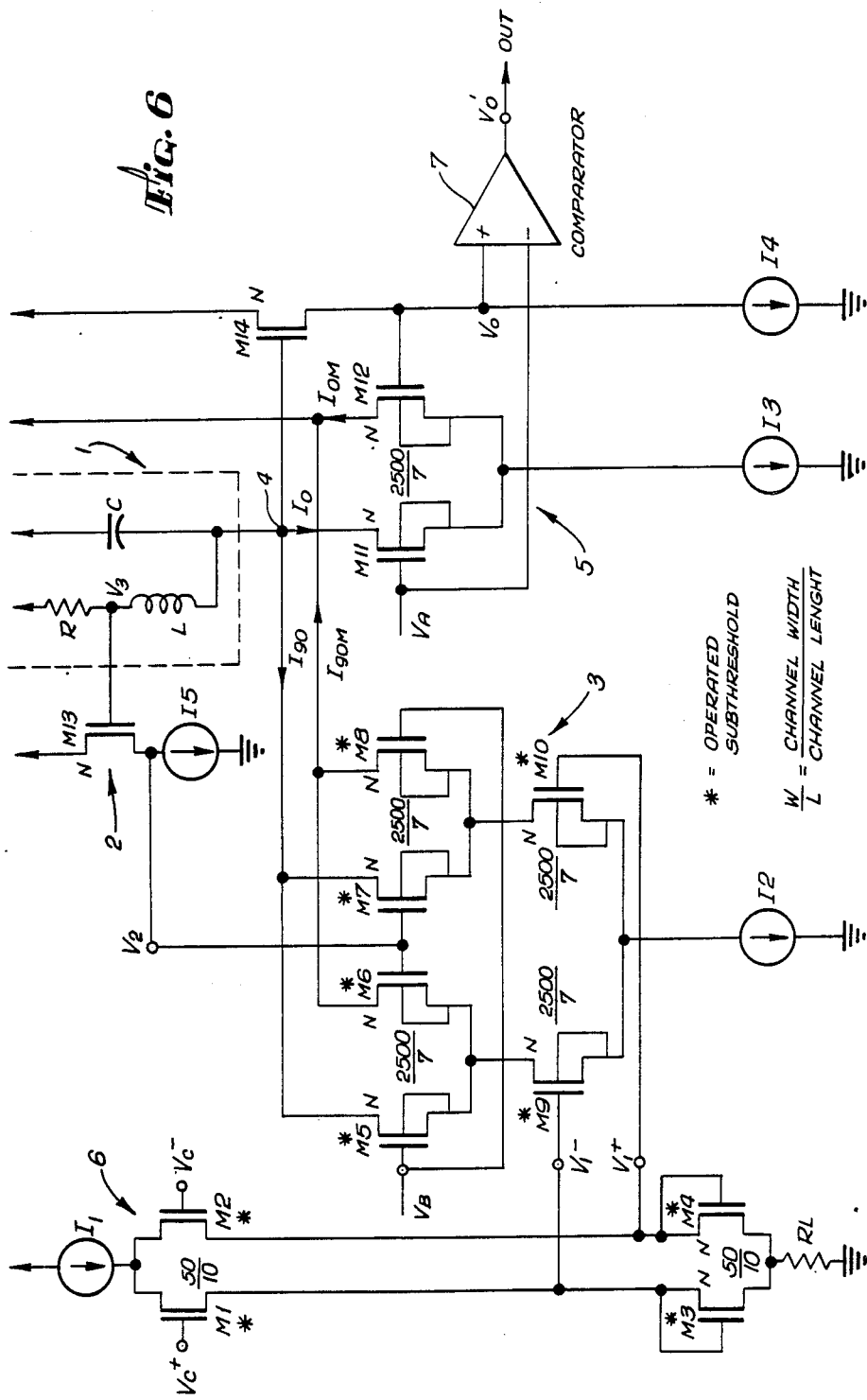

VOLTAGE CONTROLLED OSCILLATOR WITH DUAL LOOP RESONANT TANK CIRCUIT

BACKGROUND OF THE INVENTION

1. Field of the Invention

The present invention relates to a voltage controlled oscillator (VCO) and more particularly to a voltage controlled oscillator utilizing an LC type resonant tank.

2. Description of the Prior Art

Voltage controlled oscillators (VCO's) find broad application in electronic systems where voltage-to-frequency conversion is desired and are particularly useful in phase-locked loop circuits (PLL). A voltage controlled oscillator generates an AC output signal $V_o$ whose frequency, $f_o$, changes in response to a control voltage signal $V_c$ applied at an input terminal.

The output frequency $f_o$ is inversely related to the period between alternating cycles of the output signal $V_o$. A variable timing element is generally used to change the period between alternating cycles and thus change the output frequency. Typically, the variable element is either a variable capacitance diode $C_v$ (varactor) or a variable resistance device $R_v$ (see FIGS. 1A and 1B). Known devices in either category have intrinsic limitations with respect to thermal stability, linearity, adaptability to integrated circuit techniques, etc., that complicate the design of VCO circuitry.

If a VCO circuit is to be useful in a variety of environments, the output frequency $f_o$ should change linearly with the input control voltage. Linearity is optimally desired over a wide range of input voltages and a wide band of output frequencies. When the application environment is sensitive to noise at particular frequencies, it is desirable to be able to confine the harmonic content of the output signal $V_o$ to a specifiable frequency range.

Various factors prevent concurrent realization of these objectives in conventional VCO designs. For example, if a variable capacitance diode $C_v$ (varactor) is selected as the variable element that changes the frequency of the output signal, there are intrinsic non-linear characteristics associated with known variable capacitance diodes that must be compensated for. The requisite compensating circuitry prevents design of a simple VCO circuit with broad range linearity over a wide band of output frequencies and a wide range of input voltages. Known designs generally require switching among a plurality of variable capacitance diodes if broad range linearity is to be obtained. The switching circuitry adds to the cost of the VCO.

If on the other hand, a variable resistance element $R_v$ is chosen for altering the time delay T between output cycles (oscillation period), intrinsic thermal stability problems and current capacity limitations associated with known devices come into play. Some of these problems are discussed below.

Generally, two types of timing circuits, RC and LC, are used to determine the output frequency of a VCO. The classic RC circuit (FIG. 1A) has a resistor-capacitor combination coupled to a threshold detector. The product of R and C determine the amount of time needed for charging or discharging the capacitor to a predetermined voltage level $V_{threshold}$. This charge/discharge time (also referred to as the time constant of the circuit) determines the period T of oscillation of the output signal.

RC circuits have no natural or central frequency at which they prefer to oscillate. Capacitor charge time can theoretically be varied over an infinite range which allows output over a wide range of frequencies. However, the wide frequency range is a mixed blessing, since noise in the input voltage of an RC type VCO can generate an output signal which includes harmonic noise components at undesired frequencies throughout the entire frequency spectrum. In many system designs, noise needs to be contained or confined so it does not interfere with sensitive frequency ranges of a particular environment. Such noise containment is not easily achieved when an RC type VCO design is used.

RC type VCO's are limited in other respects. When a simple resistor is used to charge and/or discharge the timing capacitor of an RC circuit, the circuit exhibits poor temperature stability due to the intrinsic thermal characteristics of known resistors. Power supply fluctuations pass through the resistor easily and change the charge time of the simple resistor circuit. Unpredictable changes in temperature and/or power supply voltages reduce the circuit's reliability.

Semiconductor devices with stable electrical characterics, known as band gap devices, may be used in place of conventional resistors to provide a far more stable current source for charging the timing capacitor. Band gap devices rely on the intrinsic energy band properties of the semiconductor material from which they are made. Their output remains constant over a wide range of temperature and power supply variations. The output current available from known band gap devices is unfortunately limited to very small values. If a band gap device is to be used for charging a timing capacitor $C_t$ to a desired voltage level $V_{threshold}$ in an RC type circuit (FIG. 1A) and the circuit design requires a high frequency output (a short charging period), the band gap device will not be able to supply sufficient current to charge the capacitor unless the capacitance of the timing capacitor is reduced to very small values (10 pF or less for example). Such low capacitance values are undesirable because stray capacitance effects in the circuit become significant. These stray capacitance are unpredictable and circuit reliability suffers as a consequence. The use of band gap devices is accordingly limited to low frequency RC type VCO's.

The second type of VCO circuit, known as the LC type circuit, uses a resonant circuit or an oscillation tank to determine output frequency (see FIG. 1B). The oscillation tank circuit typically includes an inductive element L and a capacitive element $C_v$ connected in series, in parallel, or in a series-parallel combination to form a resonant tank. A feedback circuit amplifies and returns a portion of an oscillating current or voltage within the tank back to the tank to keep that oscillation signal within from decaying. The oscillation tank has a natural or central frequency ($f_c = \frac{1}{2}\pi\sqrt{LC}$) at which internal oscillation signals will prefer to oscillate. Frequency shifting in known LC type VCO designs is generally achieved by varying the capacitance value, C, of a variable capacitance element $C_v$ in the LC tank. The new capacitance alters the natural frequency $f_c$ of the tank circuit. The LC type VCO is preferred over the RC type in noise sensitive environments because noise signals at the input end of an LC type VCO produce output noise harmonics that are contained or centralized near the center (resonant) frequency $f_c$ of the tank circuit. The RC type VCO, in contrast, can generate noise with harmonics spread over a wide spectral range. The preference of the LC circuit to operate at frequencies near its natural frequency is known as the Q of the circuit.

Referring to the frequency versus magnitude graph of FIG. 2, signals in a circuit with high Q tend to oscillate at frequencies very close to the natural or central frequency $f_c$. The magnitude of harmonics outside that range is generally negligible. Low Q circuits produce harmonics of significant magnitude that are spread over a wider range of frequencies. Noise generated within a low Q circuit can therefore spread further away from the resonant frequency $f_c$ and interfere with adjacent noise sensitive frequency bands. RC type circuits have no Q, and their output signals can therefore spread over the entire frequency spectrum. The Q of a tank circuit is determined by the respective values of its inductive and capacitive elements as well as any resistive elements in the resonant circuit. If these circuit parameters change during operation of the circuit, it becomes difficult to prevent undesired interference with adjacent noise sensitive bands.

In the conventional LC type VCO circuit, a variable capacitance element $C_v$ such as a varactor diode is typically used to shift the natural or central frequency $F_c$ of an LC tank circuit and this in turn changes the frequency of the output signal Vo. When the control voltage across the varactor is varied, either intentionally or because of a noise spike, the capacitance in the tank circuit is changed, and the Q of the circuit also changes. For low frequency environments this is generally not a problem because changes in Q are acceptable in most systems. In high frequency systems, even small changes in Q may be significant because small changes in Q affect a larger range of frequencies. It is therefore undesirable to have any change in Q for such system environments, particularly when the VCO output frequency range lies close to noise sensitive frequency bands. A constant Q VCO which can confine noise harmonics to a fixed frequency range would be quite useful.

In addition to their inability to maintain constant Q, prior art LC type VCO's do not generally provide linear voltage-to-frequency conversion over a wide range of output frequencies. Known variable capacitance elements (varactors) have intrinsic bias voltage versus capacitance characteristics that are generally nonlinear. Referring to FIG. 3, the input voltage $V_c$ to output frequency $f_o$ conversion characteristics of a typical VCO utilizing a nonlinear varactor for frequency shifting is illustrated. The illustrated voltage to frequency conversion function is non-linear in general and includes a linear portion denoted as region L in which the output frequency $f_o$ is linearly related to the input control voltage $V_c$. The region between the lowest frequency $f_L$ and the highest frequency $f_H$ of region L is termed the linear band of the VCO. When linear operation is required, the control voltage $V_c$ is limited to the linear input range between $V_L$ and $V_H$. It is often desirable to have a VCO whose voltage to frequency conversion function is linear over a wide range of output frequencies and input voltages. Unfortunately, known variable capacitance elements that are available for use in conventional LC type VCO's have intrinsic non-linear characteristics that complicate design of such linear circuit.

Another design problem occurs with respect to circuit packaging. When variable capacitance VCO circuits are fabricated on integrated circuit chips, the varactor is typically formed as a separate element external of the VCO circuit chip. Varactors generally require large surface areas to achieve any useful capacitive action. If they were placed on the same chip as the rest of the VCO circuit they would waste valuable substrate area which could be put to better economic use. Off-chip varactors require external circuitry (off-chip support circuitry) for biasing and temperature compensation which adds to circuit cost and complexity. A conventional LC type VCO circuit that uses a variable capacitance element is therefore not easily minaturized because it is economically undesirable to place a varactor on the same chip with the rest of the VCO but it is also undesirable to provide off-chip support circuitry. RC circuits are in general more readily miniaturized by integrated circuit techniques, but they have other shortcomings such as their inability to provide noise containment in the frequency domain.

In summary, circuit designers face a number of considerations including circuit packaging (circuit integration), input voltage versus output frequency linearity, containment of output noise within a specified frequency range, thermal stability assurance and providing immunity to power supply fluctuations, that present problems for either the RC or LC type VCO. RC type circuits are easily integrated on IC's but they suffer from thermal instability, poor immunity to power supply changes and they cannot contain noise within a specified frequency range. Previously known LC circuits have poor linearity and are not easily minaturized onto integrated circuit chips (IC's) because they use a non-linear variable capacitance element to shift their output frequency.

SUMMARY OF THE INVENTION

The present invention provides a resonant tank type voltage controlled oscillator circuit which overcomes the above-mentioned drawbacks in the prior art by eliminating the need for a variable capacitance element. It is one object of the present invention to provide an LC type VCO with a Q factor which remains unchanged over a wide range of input voltages. It is another object of the present invention to provide a VCO circuit whose voltage to frequency conversion characteristics can be kept substantially linear over a wide range of output frequencies. It is a further object of the present invention to provide a VCO circuit that is easily miniaturized by integrated circuit techniques.

Previously known LC type VCO circuit designs relied on a variable capacitance element to achieve frequency shifting. The Q of the circuit changed when the capacitance element was varied which in turn altered the frequency containment range of the circuit. Noise containment within a specified frequency range could therefore not be assured.

According to the present invention, frequency shifting is achieved by changing the loop gain of at least one feedback loop in a plural feedback loop arrangement. Plural feedback loops pump a resonant tank with out-of-phase feedback signals. The out-of-phase feedback signals are combined to produce a resultant feedback signal whose phase angle, relative to an oscillation signal (oscillating voltage or current) within the resonant tank, varies when the loop gain of the variable feedback loop is modulated. The frequency of the oscillation signal within the tank changes to keep in step with any phase change to the resultant feedback signal.

BRIEF DESCRIPTION OF THE DRAWINGS

The invention will be described with reference to the accompanying drawings wherein:

FIG. 1A is a schematic illustrating the relevant parts of a conventional RC type voltage controlled oscillator.

FIG. 1B is a schematic illustrating the relevant parts of a conventional LC type voltage controlled oscillator.

FIG. 6 is a detailed schematic of an embodiment according to FIG. 5A.

DETAILED DESCRIPTION

Figure 4A:
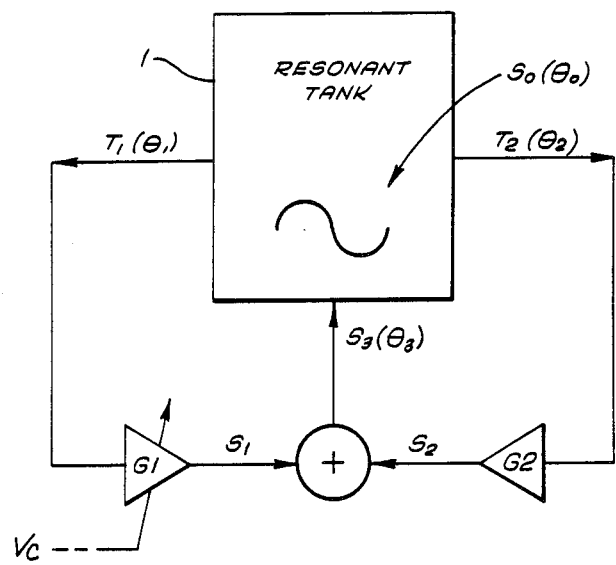
FIG. 4A is a block diagram illustrating the basic components of a dual loop arrangement according to the present invention.

FIG. 4A is a block diagram illustrating the basic components of the present invention. Two portions of a resonant tank 1 are tapped to provide tap signals $T_1$ and $T_2$. The second tap signal $T_2$ is out of phase with respect to the first tap signal $T_1$. At least one of the tap signals $T_1$ and $T_2$ is by necessity also out of phase with an internal oscillation signal (voltage or current) $S_o$ that is oscillating within the tank 1. The first and second tap signals $T_1$ and $T_2$ are fed through respective feedback loop amplifiers $G_1$ and $G_2$ to produce feedback signals $S_1$ and $S_2$. $S_1$ and $S_2$ are summed to produce a resultant feedback signal $S_3$ which is then fed into the resonant tank 1 to sustain the internal oscillation signal $S_o$ within the resonant tank. The feedback circuit of FIG. 4A reaches steady state when the energy supplied into the resonant tank by the resultant feedback signal $S_3$ reinforces the internal oscillating signal $S_o$ by returning an amount of energy equal to the energy lost by $S_o$ due to internal resistance within the resonant tank in timely fashion. The internal oscillation signal $S_o$ will tend to oscillate in step with the resultant feedback signal $S_3$. (If $S_3$ is advanced, $S_o$ speeds up in order to remain in step and the frequency of the internal oscillation signal $S_o$ increases. Likewise if $S_3$ is delayed, then the internal signal $S_o$ will slow down to keep in step and its frequency of oscillation will decrease.

Figure 4B:
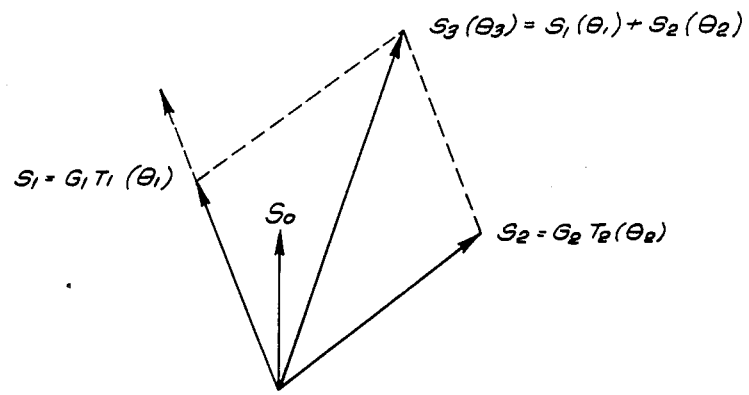
FIG. 4B is a vector diagram for explaining the operation of the embodiment of FIG. 4A.

The first feedback loop amplifier $G_1$ is a variable gain amplifier whose gain is controlled by an input voltage $V_c$. FIG. 4B is a vector diagram showing the relationship between the magnitude of the first and second feedback signals $S_1$ and $S_2$ and the phase angle of the resultant feedback signal $S_3$ relative to the internal oscillation signal $S_o$. Assuming that $S_2$ remains constant, vector $S_3$ will rotate clockwise when the magnitude of vector $S_1$ is decreased. $S_3$ will rotate counterclockwise when the magnitude of vector $S_1$ is increased. Rotation of $S_3$ in a first direction advances its phase angle relative to $S_o$ and rotation in the opposite direction alternatively causes phase angle delay with respect to the phase of $S_o$. Since $S_o$ tracks $S_3$, it will speed up or slow down to keep in step with $S_3$ and the frequency of oscillation within the resonant tank 1 will accordingly speed up or slow down when the magnitude of $S_1$ is varied.

Figure 5A:
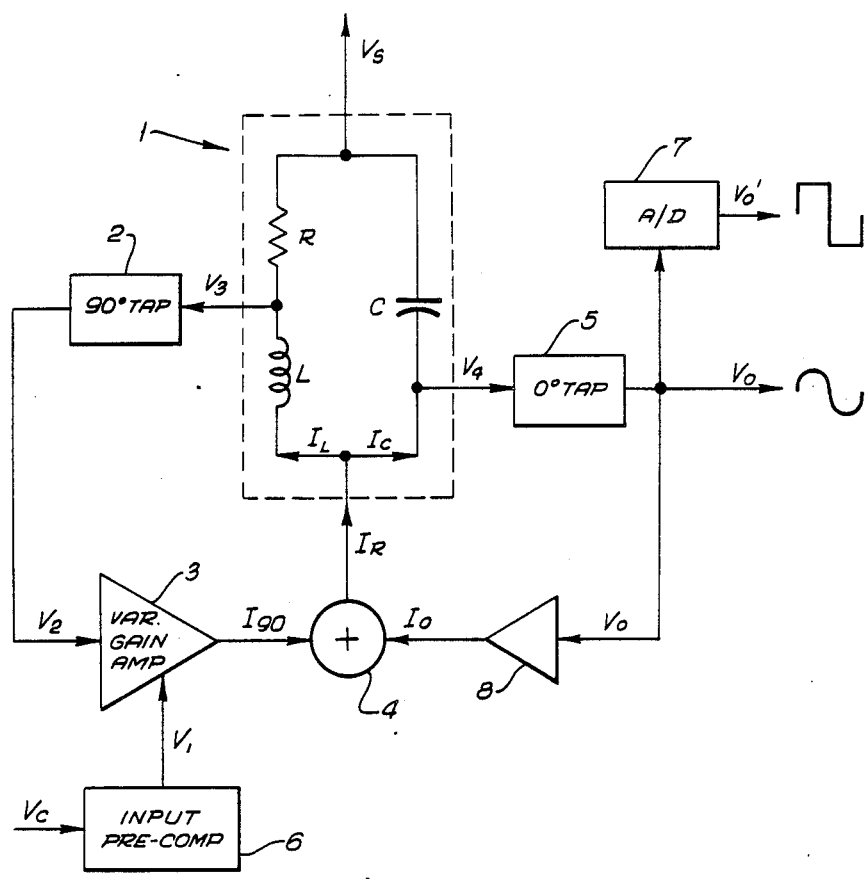
FIG. 5A is a block diagram of one dual loop embodiment according to the present invention.

FIG. 5A is a block diagram of a dual loop embodiment of the present invention. An RLC oscillation tank circuit supplied by a supply voltage $V_s$ is enclosed in the dashed box referenced by numeral 1. Two out-of-phase tap signals, $V_3$ and $V_4$ are tapped by respective tap circuits 2 and 5. Tap circuit 2 is referred to as the 90° tap circuit because $V_3$ lags $V_4$ in phase by 90°. Tap circuit 5 is correspondingly referred to as the 0° tap circuit. The 90° tap circuit 2 is connected to one end of the inductive element L of the RLC circuit to detect tap signal $V_3$. It supplies a 90° voltage component $V_2$ to a multiplier or variable gain amplifier 3 whose gain is controlled by a multiplying voltage $V_1$. The variable gain amplifier 3 produces an output current $I_{90}$ is fed into a summing circuit 4. The 0° tap circuit 5 is connected to the other end of the inductive element L to detect a second tap signal $V_4$. It generates a voltage $V_o$ that is converted to a 0° current component, $I_O$ by a converter amplifier 8 that feeds $I_O$ to the summing circuit 4. A resultant current $I_R$ is fed back to the RLC tank circuit from the summing circuit 4 to sustain an internal oscillating current (e.g. $I_L$ through inductive element L) in the tank. A control voltage $V_C$ fed through an input pre-compensation circuit 6 controls the gain of the variable gain amplifier 3. The 0° tap circuit 5 also produces an analog output signal $V_o$ (sine wave) which is fed to an analog-to-digital (A/D) converter 7 (which may be simply a voltage comparator or other threshold sensing device that causes a flip flop to toggle) for producing a digital output signal $V_o'$ (square wave).

Figure 5B:
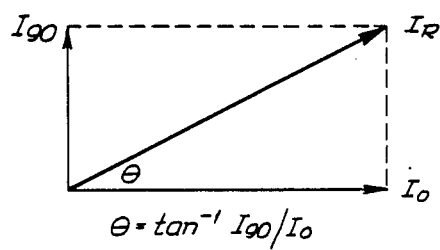
FIG. 5B is a vector diagram for explaining the operation of the embodiment of FIG. 5A.

The operation of the embodiment shown in FIG. 5A will be explained with reference to FIG. 5B. Voltage $V_3$ at one end of the inductor L is 90° out of phase with voltage $V_4$ at the other end of the inductor L. $I_O$ and $I_{90}$ are accordingly also 90° out of phase. In the phasor diagram of FIG. 5B, the 90° current component $I_{90}$ is drawn 90° out of phase with the 0° current component $I_0$. When the out-of-phase current components (vectors) $I_0$ and $I_{90}$ are combined in the summing circuit 4 they produce a resultant current vector ($I_R$) which is returned to the RLC tank 1. The magnitude of the 0° current component $I_O$ is held relatively constant in the preferred embodiment while the magnitude of the 90° current component $I_{90}$ changes in response to changes in the control voltage $V_c$ applied to the variable gain amplifier 3. The phase angle $\theta$ of the resultant current component $I_R$ relative to an internal tank oscillation signal $S_o$ ($I_L$ or $I_c$) changes in response to changes made to the magnitude of the 90° component $I_{90}$. The frequency of oscillation in the RLC tank circuit 1 is forced to a predetermined value according to the relative delay angle or phase angle $\theta$ of the resultant feedback current $I_R$.

Switching from a graphic approach to a numeric approach, the circuit in FIG. 5A may be analyzed by Laplace transform as:

$$I_R(S) = V(S)[CS + 1/(LS + R)]$$
$$= w/(S^2 + w^2)[CS + 1/(LS + R)]$$
$$= Cw\,S/(S^2 + w^2) + [w/(S^2 + w^2)][1/(LS + R)]$$

where w is the frequency of oscillation and V(S), the voltage across the capacitor C, is assumed to be sinusoidal.

Taking the inverse Laplace transform $[L^{-1}(w/(s^2+w^2))=\sin(wt)]$ we obtain:

$$I_R(t) = Cw \cos wt + [-1/wL[1 + (R/wL)^2]] \cos wt +$$
$$R/w^2L^2 [1 + (R/wL)^2] \sin wt +$$
$$[-1/wL[1 + (R/wL)^2]]e^{-(R/L)t}$$

Dropping the last term which goes to zero as $t \to \infty$, we can break $I_R(t)$ into quadrature components:

$$I_{90}(t) = Cw \cos wt + [-1/wL[1+(R/wL)^2]] \cos wt$$
$$I_O(t) = R/w^2L^2[1+(R/wL)^2] \sin wt$$

If the circuit is designed with $wL >> R$, causing it to act as a high Q system, then $I_{90}(t)$ simplifies to $[Cw-(1/wL)] \cos wt$. We can see that the magnitude of $I_{90}$ is a function of frequency, w. Conversely w is a function of $I_{90}$'s magnitude. The oscillation frequency, w, is controlled according to the present invention by adjusting the magnitude of $I_{90}$ to a desired value. When the magnitude of $I_{90}$ is set to zero, $Cw-(1/wL)=0$ and w becomes $1/\sqrt{LC}$ which is the natural frequency of the LC tank. When the magnitude of $I_{90}$ is shifted either positive or negative, the oscillating signal frequency shifts in a corresponding direction away from the central frequency. The Q of the circuit remains unchanged however. For any arbitrary magnitude, A, the equation $Cw-(1/wL)=A$ is solved to determine w. If the design is further limited such that $AwL >> 1$ then a linear relationship between frequency and magnitude results, $Cw=A$. In the preferred embodiment, the amplitude A of $I_{90}$ is adjusted to be much smaller than the amplitude of $I_O$.

It is to be understood that the actual circuit currents represented by $I_O$ and $I_{90}$ are not necessarily exactly 90 degrees out of phase with each other, there are delays (phase shifts) introduced within their respective feedback loops which affect their actual phase relationship.

The invention is not limited to an RLC tank circuit formed with discrete resistive, inductive and capacitive components; the out-of-phase tap signals $T_1$ and $T_2$ can be tapped from different points of other kinds of oscillation tanks such as for example, from different locations on an oscillator crystal, an integral tank circuit (high frequency structures), etc.

Figure 7:
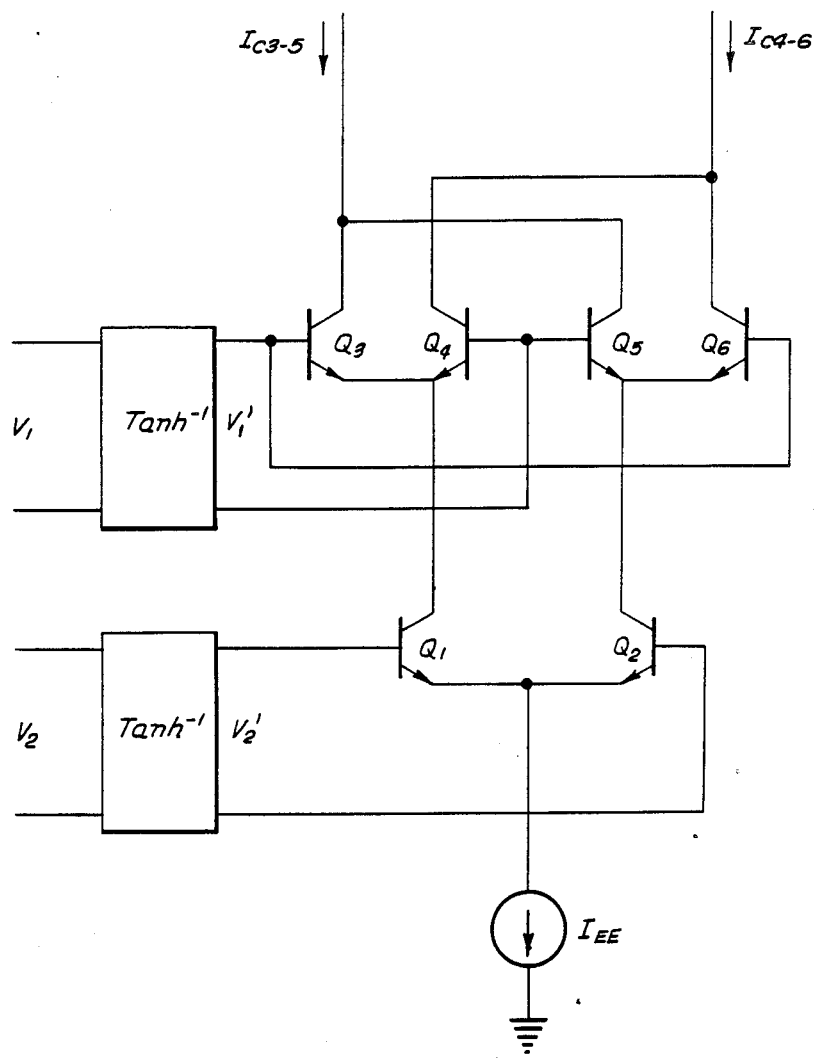
FIG. 7 is a schematic diagram of a known Gilbert multiplier.

FIG. 6 is a detailed schematic of the preferred embodiment of an oscillator structure according to the block diagram of FIG. 5A. Corresponding voltage nodes and current loops retain the same reference symbols as in FIG. 5A. Some signals in FIG. 5A appear as differential signal pairs in FIG. 6 (for example, $V_c$ becomes $V_c^{30}$ and $V_c^-$). The embodiment of FIG. 6 is constructed using CMOS technology. $I_1$ through $I_5$ are fixed current sources whose currents are controlled with band gap devices which, as discussed earlier, provide excellent temperature stability. The variable gain amplifier 3 of FIG. 1 is a Gilbert multiplier formed by MOS devices M5 through M10. A bipolar Gilbert multiplier is disclosed in Gray and Meyer, *Analysis and Design of Analog Integrated Circuits*, at pages 563-570 which disclosure is incorporated herein by reference. A known Gilbert multiplier with predistortion input circuits is shown in FIG. 7.

The bipolar devices of the known Gilbert multiplier (FIG. 7) have been converted to MOS devices for the present embodiment. M5 through M8 form a quadrature output stage whose bias is set by M9 and M10. The variable gain amplifier 3 functions as a hyperbolic tangent multiplier (tan h). Its active devices are preferably biased to operate in the subthreshold or lightly turned-on region for enhanced gain. Voltage $V_B$ applied to the gate of $M_s$ is a reference voltage which establishes a bias midpoint for the amplifier. An input pre-compensation circuit 6 formed by M1 through M4 serves as an inverse hypobolic tangent multiplier (1/tan h) for linearizing response to an applied control voltage $V_c$.

M13 and I5 form the tap circuit 2 and comprise a voltage shifter that functions as a DC level shifter and isolation amplifier supplying the 90 degree voltage component $V_2$ to the variable gain amplifier 3 at the gates of M6 and M7 with a DC shift that moves the mid level of $V_2$ near respective bias midpoints of M6 and M7. M14 and I4 form a 0 degree voltage level shifting tap circuit 5 that supplies the 0 degree voltage component $V_0$ to M12 of differential pair M11/M12. M11 sinks $I_0$ from the tank while M12 sinks its mirror current $I_{OM}$ from the voltage supply. Connections to the voltage supply are indicated by up arrows in FIG. 6. Reference voltage $V_A$ is applied to the gate of M11 to establish a bias for the differential pair. M5, M7 of the Gilbert multiplier pump $I_{90}$ into the summing node while M6, M8 sink its mirror $I_{90M}$ from the supply. M14 and M11/M12 form the main feedback loop delivering the zero degree current component $I_O$ to the LC tank circuit. I3 is a constant current source driving the current mirror circuit formed by M11 and M12.

A secondary feedback loop is formed by level shifter M13 and the Gilbert multiplier 3. The magnitude of $I_{90}$ is controlled by $V_1^-$ and $V_1^+$ supplied to the gates of M9 and M10 from the precompensation circuit M1-M4. Differential control voltage $V_c^+$ and $V_c^-$ is applied to the gates of M1 and M2 of the precompensation circuit to control the magnitude of $I_{90}$. Changes in the effective phase angle of the feedback current $I_R = I_{90} + I_0$ alter the frequency of oscillation of the dual loop feedback circuit by advancing or delaying the feedback signal as discussed earlier. Analog output signal $V_o$ produced by M14 is typically a sinusoidal wave that is converted to a digital output signal $V_O'$ (square wave) by a comparator 7.

Figure 2:
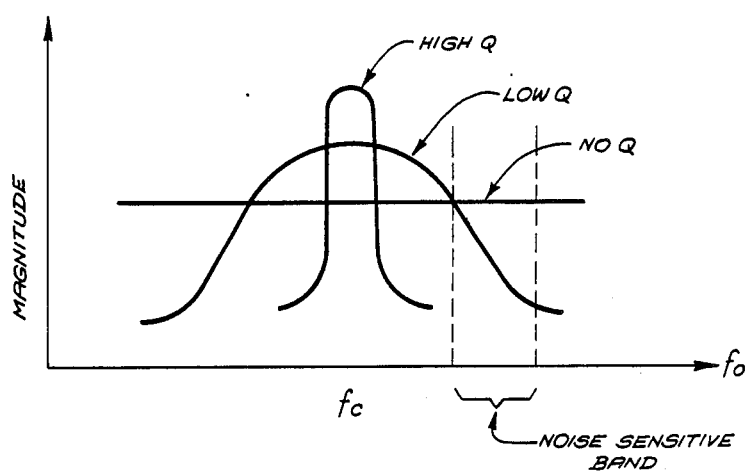
FIG. 2 is a frequency versus harmonic magnitude diagram for explaining output frequency containment.
Figure 3:
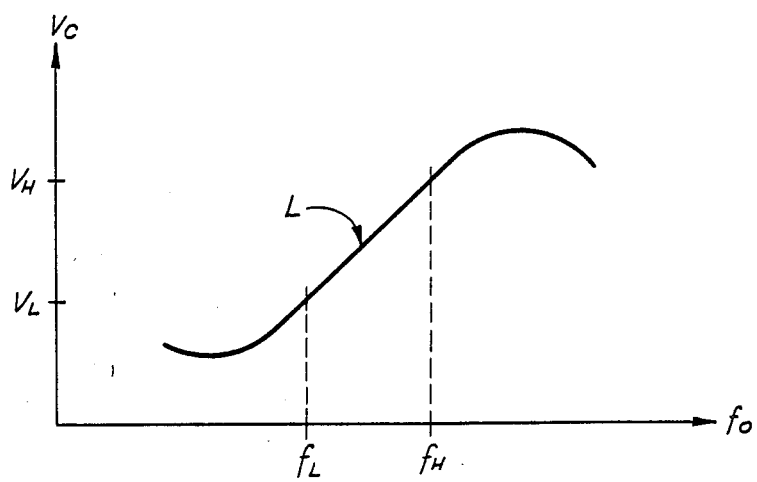
FIG. 3 is a graph for explaining the voltage to frequency conversion characteristics of an LC type voltage controlled oscillator.

Current sources I1 and I2 are preferably adjusted so their respective MOS devices, M1 through M10, operate in the subthreshold region. These devices exhibit an exponential $V_{GS}$ to $I_{DS}$ relationship within the subthreshold region of their operating characteristic. The gain of the Gilbert multiplier 3 is remarkably enhanced by operating in the subthreshold region but the current output of each device is quite small at normal fabrication dimensions. According to the present invention however, M1 through M10 are formed with very wide channels, preferably 2500 microns wide as compared to the 10 micron width of normal devices, in order to provide sufficient operating current. In the preferred embodiment, the Gilbert multiplier output stage (M5-M8) operates at current levels in the range of 10 to 100 microamps. With the improved gain provided by operating at the subthreshold region, it is possible to design a VCO whose voltage-to-frequency conversion factor (slope of the linear portion L in the curve shown in FIG. 3) is quite large.

The RLC tank is preferably formed of fixed elements R, L and C. Unlike the prior art, element C does not have to be a variable capacitance element. When C is fixed, it does not require a temperature compensation circuit or biasing circuit as was required for the prior art varactor designs. The VCO circuit can be integrated on an integrated chip with the number of external or "off-chip" components minimized to just the L, R and C elements. In the preferred embodiment the VCO circuit is formed almost entirely on a single integrated circuit chip with two pin connections to the R, L, and C elements of the tank circuit. Since R, L and C remain fixed, the Q of the circuit remains unchanged. Cascode amplifiers (not shown) are preferably employed in the circuit of FIG. 6 to increase the current levels of the quadrature current components $I_o$ and $I_{90}$ supplied to the RLC tank circuit from their respective current sinks M11 and M5/M7. The increased current limits noise problems in the tank circuit at higher frequencies.

With the capacitive element C fixed in the described dual loop VCO, the circuit can be designed with generally linear voltage to frequency conversion characteristics over a wide range of output frequencies. While the system described above is the preferred embodiment of the present invention, it will become apparent to those skilled in the art that many variations are possible. The present invention is therefore not to be limited to the illustrated embodiments but rather defined according to the following claims and equivalents thereof.

What is claimed is:

1. A voltage controlled oscillator comprising:
   a resonant tank having a predetermined resonant frequency and including first and second tap points for tapping out-of-phase oscillating signals occurring internally within said tank;
   first tap means coupled to said first tap point of said tank for providing a first feedback signal;
   second tap means coupled to said second tap point of said tank for providing a second feedback signal which is out-of-phase with said first feedback signal;
   summing means for combining said first and second feedback signals to produce a resultant feedback signal and for feeding said resultant feedback signal back into said tank to sustain the oscillating signals within said resonant tank; and
   magnitude changing means, responsive to a supplied control voltage, for varying the magnitude of said second feedback signal to thereby advance or delay the phase angle of said resultant feedback signal relative to said internal oscillating signals and change the frequency of oscillation of said internal oscillating signals.

2. A voltage controlled oscillator according to claim 1 wherein said second feedback signal is approximately 90 degrees out of phase with said first feedback signal.

3. A voltage controlled oscillator according to claim 1 wherein said tank includes an inductive element with first and second ends and said first tap point of said tank is coupled to said first end of said inductive element and said second tap point is coupled to said second end of said inductive element.

4. A voltage controlled oscillator according to claim 1 wherein said magnitude changing means includes a variable gain amplifier and input compensation means coupled to said variable gain amplifier for linearly varying the gain of said variable gain amplifier in response to said control voltage.

5. A voltage controlled oscillator according to claim 1 wherein said magnitude changing means comprises a Gilbert multiplier.

6. A voltage controlled oscillator according to claim 5 wherein said Gilbert multiplier is operated in a subthreshold region.

7. A voltage controlled oscillator according to claim 6 wherein said Gilbert multiplier includes a constant current source comprising a band gap device.

8. A voltage controlled oscillator according to claim 1 further comprising analog to digital conversion means coupled to said tank for producing a digital output signal.

9. A voltage controlled oscillator according to claim 1 wherein said summing means includes a current summing node.

10. A voltage controlled oscillator according to claim 1 wherein said first and second tap means, said summing means, and said magnitude changing means are fabricated on a single chip substrate.

11. A voltage controlled oscillator according to claim 10 wherein said inductive and capacitive elements of said tank circuit are located external of said chip substrate.

12. A voltage controlled oscillator according to claim 1 wherein said tank is comprised of fixed inductive and capacitive elements.

13. A voltage controlled oscillator comprising:
    resonant tank means for sustaining an internal oscillation signal;
    tap means, coupled to said resonant tank means, for producing first and second tap signals that are out of phase with respect to one another;
    variable gain means, responsive to an applied input signal and coupled to said tap means, for multiplying said first tap signal with said input signal to produce a first feedback signal of a first magnitude;
    reference gain means, coupled to said tap means, for multiplying said second tap signal by a reference factor to produce a second feedback signal of a second magnitude; and
    feedback means for returning said first and second feedback signals to said resonant tank means to thereby reinforce said internal oscillation signal sustained by said resonant tank means;
    wherein said internal oscillation signal oscillates at a frequency determined by the ratio of said first and second magnitudes.

14. A voltage controlled oscillator according to claim 13 wherein,
    said feedback means includes summing means for adding said first and second feedback signals to produce a resultant feedback signal that is returned to said resonant tank means.

* * * * *